(12) United States Patent
Lahtinen et al.

(10) Patent No.: US 7,894,229 B2
(45) Date of Patent: Feb. 22, 2011

(54) 3D CHIP ARRANGEMENT INCLUDING MEMORY MANAGER

(75) Inventors: Vesa Lahtinen, Kangasala (FI); Tapio Hill, Helsinki (FI); Kimmo Kuusilinna, Tampere (FI); Jari Nikara, Tampere (FI); Mika Kuulusa, Helsinki (FI); Tommi Makelainen, Loimaa (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/343,223

(22) Filed: Dec. 23, 2008

(65) Prior Publication Data

US 2009/0147557 A1     Jun. 11, 2009

Related U.S. Application Data

(63) Continuation of application No. 11/543,351, filed on Oct. 5, 2006, now Pat. No. 7,477,535.

(51) Int. Cl.
*G11C 5/02* (2006.01)
(52) U.S. Cl. .......................................... 365/51; 365/63
(58) Field of Classification Search ................ 365/63, 365/51; 257/499
See application file for complete search history.

(56) References Cited

U.S. PATENT DOCUMENTS

| 5,245,441 | A | | 9/1993 | Ruben |
| 5,399,898 | A | * | 3/1995 | Rostoker .................... 257/499 |
| 5,590,329 | A | | 12/1996 | Goodnow, II et al. |
| 5,829,034 | A | | 10/1998 | Hagersten et al. |
| 6,064,120 | A | | 5/2000 | Cobbley et al. |
| 6,275,916 | B1 | | 8/2001 | Weldon, Jr. et al. |
| 6,393,498 | B1 | | 5/2002 | Hou et al. |
| 6,473,773 | B1 | | 10/2002 | Cheng et al. |
| 6,708,331 | B1 | | 3/2004 | Schwartz |
| 6,985,976 | B1 | | 1/2006 | Zandonadi et al. |
| 7,076,599 | B2 | | 7/2006 | Aasheim et al. |
| 7,098,541 | B2 | | 8/2006 | Adelmann |

(Continued)

OTHER PUBLICATIONS

Office Action dated Jul. 14, 2009 from U.S. Appl. No. 11/543,688, 18 pages.

(Continued)

*Primary Examiner*—Son Dinh
(74) *Attorney, Agent, or Firm*—Hollingsworth & Funk, LLC (57) ABSTRACT

Systems, apparatuses and methods involving centralized memory management capable of allocating and de-allocating memory for all subsystems dynamically. One embodiment involves a base substrate, a logic die(s) on the base substrate and having a subsystem(s), a memory die(s) having a memory module(s), a memory management unit, a first data interface connecting the memory management unit with the at least one logic die, a second data interface connecting the memory management unit with the at least one memory die, a configuration interface connecting the memory management unit with the at least one memory die, where the configuration interface includes face-to-face connections, a control interface connecting the memory management unit with the at least one logic die, where the memory die(s) and the logic die(s) are arranged in a stacked configuration on the base substrate, and the memory management unit is adapted for managing memory accesses from the subsystem(s) by negotiating an allowed memory access with the subsystem(s) via the control interface and configuring the at least one memory module according to the allowed memory access via the configuration interface.

22 Claims, 10 Drawing Sheets

U.S. PATENT DOCUMENTS

| | | | |
|---|---|---|---|
| 7,115,986 B2 | 10/2006 | Moon | |
| 7,235,870 B2 | 6/2007 | Punzalan | |
| 7,276,794 B2 | 10/2007 | Wilner | |
| 7,315,903 B1 | 1/2008 | Bowden | |
| 2004/0154722 A1* | 8/2004 | Cobbley et al. | 156/64 |
| 2006/0091508 A1* | 5/2006 | Taggart et al. | 257/678 |
| 2006/0197221 A1* | 9/2006 | Bruno | 257/724 |
| 2006/0236063 A1 | 10/2006 | Hausauer et al. | |
| 2006/0289981 A1 | 12/2006 | Nickerson et al. | |
| 2007/0023887 A1 | 2/2007 | Matsui | |
| 2007/0070669 A1 | 3/2007 | Tsern | |
| 2007/0283115 A1 | 12/2007 | Freeman et al. | |
| 2008/0079808 A1 | 4/2008 | Ashlock et al. | |
| 2008/0086603 A1 | 4/2008 | Lahtinen et al. | |

OTHER PUBLICATIONS

Office Action Response to office action dated Jul. 14, 2009 submitted Oct. 14, 2009 for U.S. Appl. No. 10/543,688, 11 pages.
Office Action dated Jan. 6, 2010 from U.S. Appl. No. 11/543,688, 17 pages.
Office Action Response to office action dated Jan. 6, 2010 submitted Feb. 5, 2010 for U.S. Appl. No. 10/543,688, 11 pages.
Office Action Response with RCE to office action dated Jan. 6, 2010 submitted Mar. 16, 2010 for U.S. Appl. No. 10/543,688, 11 pages.
Office Action Response to office action dated Jul. 14, 2009 submitted Oct. 14, 2009 for U.S. Appl. No. 11/543,688, 11 pages.
Office Action Response to office action dated Jan. 6, 2010 submitted Feb. 5, 2010 for U.S. Appl. No. 11/543,688, 11 pages.
Office Action Response with RCE to office action dated Jan. 6, 2010 submitted Mar. 16, 2010 for U.S. Appl. No. 11/543,688, 11 pages.
May 7, 2010, Office Action dated May 7, 2010 from U.S. Appl. No. 11/543,688, 20 pages.

* cited by examiner

3D CHIP ARRANGEMENT INCLUDING MEMORY MANAGER

CROSS-REFERENCE TO RELATED APPLICATIONS

This is a continuation application of U.S. Pat. No. 7,477,535, the contents of which is incorporated herein by reference in its entirety.

FIELD OF THE INVENTION

The present invention relates to electronic chip arrangements, particularly to a 3-dimensional chip arrangement for a mobile electronic device, including a memory manager.

BACKGROUND OF THE INVENTION

A mobile terminal comprises several components which all have their dedicated tasks related to the communication and application services provided to the user of the terminal. These components are frequently designed separately from each other and commonly they each have their own memories for storing data and instructions.

Ad-hoc use of memories is a big problem in mobile terminals. This situation is caused by the design style where memories are reserved for dedicated purposes and secure runtime allocation of unused memory for other purposes is very difficult or even impossible.

Implementing a modular system with separated subsystems is a difficult task. In particular, the memory subsystem needs to be considered carefully. It should offer high performance, secure data storage, low power consumption, reliable packaging, and low costs. To enable a modular design style, each subsystem should have its own memories. On the other hand, a more cost effective solution is to have a centralized memory distributed to all the subsystems. A centralized memory manager can make the memory look (logically) dedicated for a single subsystem, although it is (physically) accessible by all.

An additional issue with current memory implementations is that they do not scale very well. The bus widths remain flat at 16/32 bits and the frequencies cannot be increased dramatically due to the increasing power consumption associated therewith.

Furthermore, DRAMs (dynamic random access memory) and other memories are on similar but still different technology tracks than logic circuits. That is, the DRAM and logic dies are fabricated in different processes, e.g. also with different structure widths (90 nm vs. 130 nm etc.). Nevertheless, the connections between the DRAM and logic dies should be short (for enabling fast speeds/low latencies and low power consumption) and large with respect to their quantity (for enabling large bandwidths). These are requirements that are impossible to meet with traditional technologies since conventional dies have bonding pads only on their sides.

Conventionally, large parts of the memories of a mobile terminal have been dedicated to a limited set of purposes. The global memory has been divided among very few (1-2) subsystems statically. No system level guarantees with respect to data security have been offered. In addition, the performance and power issues have not been dealt with.

As mentioned above, memory is a critical resource in a mobile terminal. Mobile terminals have multiple concurrent subsystems sharing the same execution memory, which is usually DRAM. This makes the execution memory a performance bottleneck in the system. The slow evolvement of the bandwidth offered by an external DRAM compared to the very fast growth of logic speed and functionality (so called Moore's law) is a well-known fact. It has been visible in the PC-industry for decades but these issues have also recently begun to emerge in mobile terminals.

The PC-way of dealing with the memory bandwidth problem is to have multiple levels of hierarchy (caches) in the architecture and to utilize very high frequencies in the memory I/O bus. Both of these techniques burn a lot of power and are therefore difficult to use in a power-limited system like a mobile electronic device. If the depth of the memory hierarchy or the bus frequency cannot be increased, the only option that is left is to increase the width of the memory bus. Because the width of the bus is dictated by current standards and limited by the standard packaging technologies of mobile DRAMs this cannot be done without a new technology for connecting memory and logic. Traditionally mobile DRAMs have followed the general-purpose (PC) DRAMs with a small, few years delay. The bit widths of standard DRAMs have not increased beyond 16/32 bits, so the only way for the DRAMs to increase bandwidth has been to increase I/O bus frequency. In addition, several "one-time tricks" have been used, e.g. utilizing both edges of the bus clock to transfer two data elements in one clock cycle (DDR=double data rate). On the logic die this has forced the utilization of more and more levels in the cache hierarchy. As stated before, this is not a power-efficient way to increase memory bandwidth.

The prior art therefore has a number of disadvantages. There is no standardized memory management scheme for global execution memory that would be applicable to a widespread mobile terminal use. System packaging using the conventional techniques is becoming very complex in mobile terminals, which constitutes a very high bill-of-materials (BOM). The upcoming multiprocessor architectures create a number of new problems. Particularly, memory coherency must be maintained, which is non-trivial. That is, the memory architecture must guarantee that one processor cannot change the data of another processor in an uncontrolled manner.

Modular architectures require distributed memory to exploit the natural advantages of that scheme. Physically distributed memory is prohibited due to the associated costs, so a memory architecture should be able to emulate distributed memory with physically centralized memory (external DRAM). Moreover, in modular and multiprocessor designs it is important that the components cannot access memory in an uncontrolled manner. This would be a security problem and memory over-allocation could cause software crashes or quality-of-service mishaps. The consistently rising physical distance between memory and the subsystems using it is also becoming a problem. Increasing the distance means increased power consumption and delay which is undesirable.

SUMMARY OF THE INVENTION

According to one aspect of the invention, a chip arrangement is provided that includes a base substrate, at least one logic die located on the base substrate and comprising at least one subsystem, at least one memory die stacked on top of the at least one logic die and comprising at least one memory module. The exemplary chip arrangement further includes a memory management unit, a first data interface connecting the memory management unit with the at least one logic die, a second data interface connecting the memory management unit with the at least one memory die, the second data interface comprising face-to-face connections, a configuration interface connecting the memory management unit with the at least one memory die, the configuration interface including face-to-face connections, a control interface connecting the memory management unit with the at least one logic die, a power interface adapted to provide electrical power to the at least one logic die, the at least one memory die and the memory management unit, and a data input/output interface connected with the at least one logic die. In this exemplary method of the invention, the memory management unit is adapted for managing memory accesses from the at least one subsystem by negotiating an allowed memory access with the subsystem(s) via the control interface and configuring the memory module(s) according to the allowed memory access via the configuration interface.

It is to be noted that in case of two or more logic dies the control interface connects them. Additionally in exemplary embodiments the two or more logic dies can also communicate through the memory.

In an exemplary embodiment the memory management unit comprises a main unit and the at least one subsystem comprises a sub-unit, wherein the main unit is connected with the configuration interface and the at least one sub-unit is connected with the first and the second data interface.

In an exemplary embodiment the chip arrangement comprises at least two memory dies stacked on top of each other. Also, the subsystem dies may either be arranged below one or more stacked memory dies, or alternatively next to the memory dies on the chip base substrate. Several logic dies/subsystem dies may also be arranged horizontally or vertically connected in the chip package.

In an exemplary embodiment the second data interface and the configuration interface comprise through-VIAs through the memory dies.

In an exemplary embodiment the memory management unit is implemented on a further separate die, but may, in other exemplary embodiments, also be provided on one of the other existing dies of memory units and logic subsystems.

In an exemplary embodiment the memory management die is stacked between the at least one logic die and the at least one memory die.

In an exemplary embodiment the at least one memory die comprises at least two memory modules and at least one router connected with the at least two memory modules and the second data interface, the at least one router being adapted for routing data traffic to and from the at least two memory modules.

In an exemplary embodiment the second data interface and the configuration interface are logical interfaces sharing a single physical interface.

In an exemplary embodiment the chip arrangement comprises at least two logic dies stacked on top of each other.

In an exemplary embodiment the memory die comprises a control unit connected with the configuration interface adapted to control the at least one memory module and for being configured by the memory management unit.

In an exemplary embodiment the control interface is implemented in the base substrate.

In an exemplary embodiment the memory management unit is adapted for controlling the power interface for selectively powering down at least one of the at least two memory units, which may be separate memory dies or memory banks within a single die. The powering down may for example be initiated by one of the memory dies/memory banks, or alternatively by an external request.

In an exemplary embodiment the at least one memory die comprises at least two memory units, and wherein the memory management unit is adapted for controlling the power interface for selectively powering down at least one of the at least two memory units.

According to another aspect of the invention a chip means is provided that includes a substrate means, at least one logic means located on the substrate means and comprising at least one subsystem means, at least one memory means stacked on top of the at least one logic means, and comprising at least one memory module means, a memory management means, a first data interface means connecting the memory management means with the at least one logic means, a second data interface means connecting the memory management means with the at least one memory means, a configuration interface means connecting the memory management means with the at least one memory means, a control interface means connecting the memory management means with the at least one logic means, a power interface means adapted to provide electrical power to the at least one logic means, the at least one memory means and the memory management means, and a data input/output means connected with the at least one logic means, where the memory management means is adapted for managing memory accesses from the at least one subsystem means by negotiating an allowed memory access with the at least one subsystem means via the control interface means and configuring the at least one memory module means according to the allowed memory access via the configuration interface means.

The above summary of the invention is not intended to describe every embodiment or implementation of the present invention. Rather, attention is directed to the following figures and description which sets forth representative embodiments of the invention.

BRIEF DESCRIPTION OF THE DRAWINGS

The invention can be more fully understood by the following detailed description of exemplary embodiments, when also referring to the drawings, which are provided in an exemplary manner only and are not intended to limit the invention to any particular embodiment illustrated therein. In the drawings

DETAILED DESCRIPTION OF EMBODIMENTS OF THE INVENTION

According to the invention the problems with the prior art are overcome by a chip arrangement having a centralized memory management unit that is capable of allocating and de-allocating memory for all subsystems dynamically. This also hides the actual memory implementation from the software running on the subsystems.

That is, the invention is based on the provision of a centralized memory management unit that provides a unified view of the memory architecture for all subsystems regardless of the actual physical implementation of the memory. A memory interface is used for data transfers between memory subsystem (which includes the memory management unit) and the subsystems. Control messages between subsystems and between the memory management unit and the subsystems are passed through a control interface.

Figure 1:
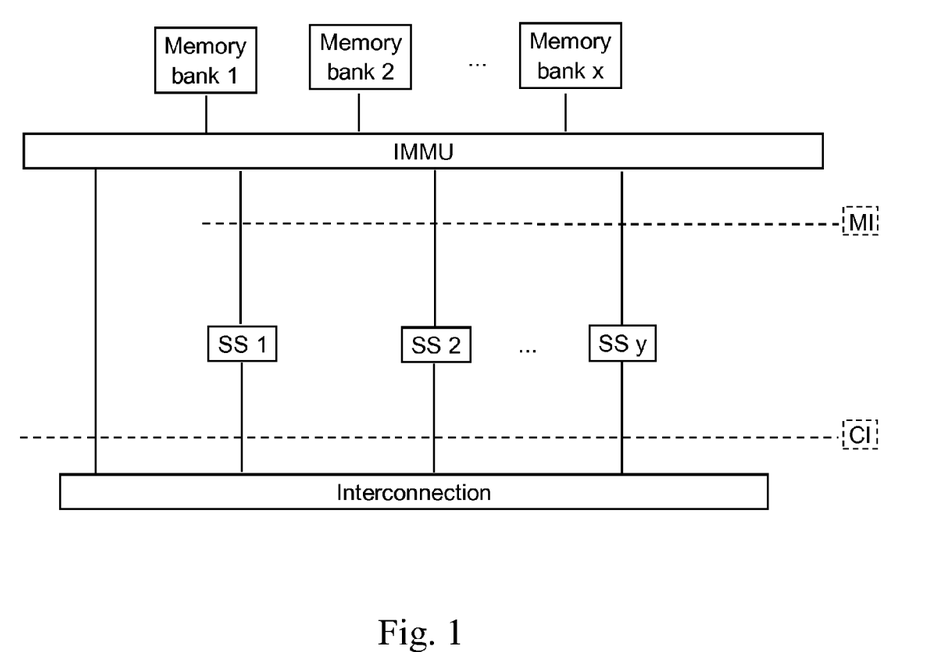
FIG. 1 illustrates the basic logical parts of an exemplary embodiment of the invention.

The basic logical parts of an exemplary embodiment of the invention are depicted in FIG. 1. This figure presents a high-level architecture view which shows the components and the interfaces needed by the implementation.

A plurality (1 . . . x) of memory banks is connected with an intelligent memory management unit (IMMU). The memory management unit in turn is connected with a plurality of subsystems (SS1 . . . SSy), via a memory interface (MI). The subsystems are interconnected via a control interface (CI), which is also connected with the memory management unit. The subsystems are only able to access any of the memory banks through the memory management unit. No subsystem can actually access the memory without the permission and memory management performed by the memory management unit. Hence, the memory management unit is logically always between the memory modules and the subsystems. As depicted in FIG. 1, the memory management unit can also be seen as just another subsystem with its own dedicated interface to memory.

The 3D implementation of the intelligent memory management unit (IMMU) according to the invention refers to the modular way of designing a system or chip arrangement, respectively, out of separate dies. Subsystem (SS) dies and memory dies (and in some embodiments memory management unit die(s)) are stacked on top of each other on an underlying base substrate, forming a connection in the Z-direction (which may be seen as a "Z-bus"). The Z-bus may be implemented with silicon-through VIAs that run through all the stacked dies.

Figure 2:
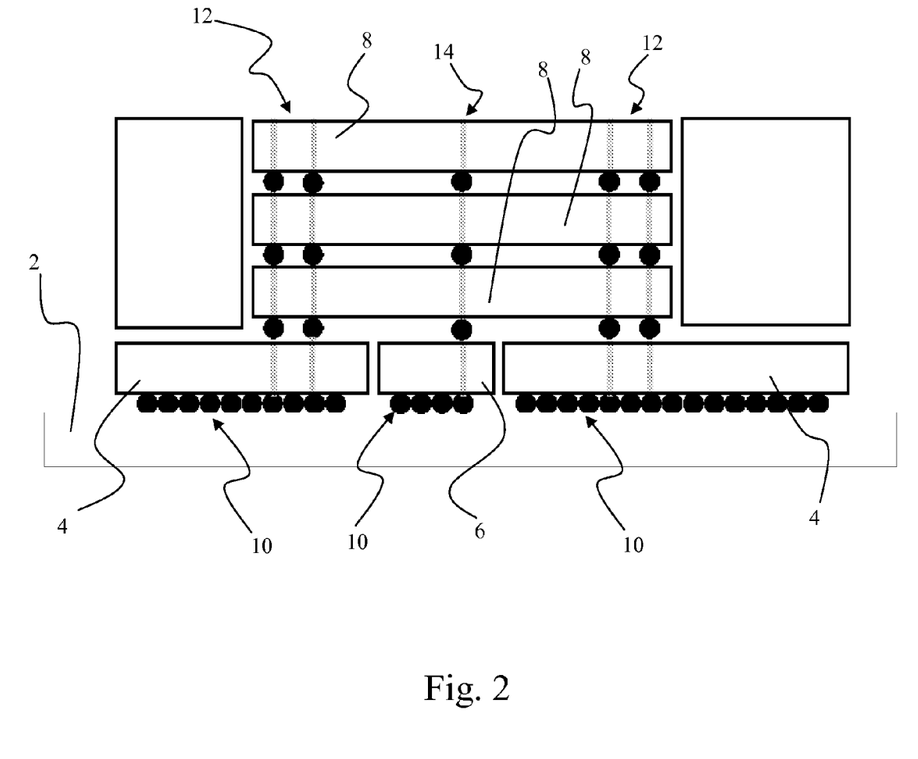
FIG. 2 is a cross-section of a 3D chip arrangement according to an embodiment of the invention.

FIG. 2 depicts a basic structure of an exemplary embodiment of the invention. On an underlying base substrate 2 logic dies 4 are arranged. On top of the logic dies 4 three memory dies 8 are stacked. A memory management unit 6 is also provided, in this case as a or on a further separate die. However, the invention is not limited to this example. The memory management unit 6 can also be distributed to several physical entities, that is, e.g. be implemented in one of the subsystems dies 4 or memory dies 8.

This figure shows an example implementation using a memory management unit 6. In this implementation, each subsystem 4 is located on a separate die and the component dies (including the DRAM=memory) are connected with a face-to-face attachment.

In this concept the Z-bus connections, i.e. the memory (e.g. DRAM) sockets, needs to be defined with respect to their number and location. On an underlying base substrate 2 two subsystem dies or logic dies 4, respectively, are arranged. In the example shown here the subsystems dies 4 are arranged horizontally. However the invention is not limited to this particular arrangement. In advanced embodiments it is also possible to have two or more logic dies stacked in a vertical direction.

A control interface 10 connects the logic dies 4 with each other and the memory management unit 6. In the example shown here the control interface 10 is implemented within or on, respectively, the base substrate 2. The invention is, however, not limited to this example, the control interface 10 can be implemented without using the base substrate 2.

On top of the logic dies 4 and the memory management unit 6, memory dies 8 (DRAMs), in this case three thereof, are arranged in a stacked manner. That is, they are stacked onto the logic dies 4 and the memory management unit 6 in a vertical direction. A memory interface 12 is provided connecting the memory dies 8 with the logic dies 4 and the memory management unit 6. The memory interface 12 is implemented using silicon through-VIAs running vertically through all the memory dies 8 and also using face-to-face connections between the separate dies. A configuration interface 14 is implemented in the same manner, with silicon through-VIAs and face-to-face connections, between the DRAMs 8 and the memory management unit 6. The configuration interface 14 is used by the memory management unit 6 to configure a control unit of the DRAMs 8 to adhere to the memory management scheme of the invention. The configuration is done for memory module (implementation) specific control. These operations include things like chip enables, assigning module numbering, Router IDs in networked implementations (see below), power control (turning off unused memory banks), etc.

The memory management unit may manage the available memory units, such as several memory dies and/or memory banks on a single chip, in various ways. In some exemplary embodiments, the memory management is effected by assigning a unique identifier to each allocated memory region. This identifier will be referred to as a region code or handle for purposes of this description. Also, each subsystem may be given a unique subsystem identifier. The memory management unit may then be provided with a database or table where region codes of memory regions are stored along with the subsystem identifier of the respective subsystem to which the respective region is currently allocated. In this way, the memory management unit is able to define the ownership for a certain memory region. If it is not prohibited by some further conditions, a memory region could also have more than one owner at a time, i.e. more than one subsystem could be allowed to access a memory region.

In such a parameter table, further parameters may be stored and managed by the management unit. Examples are physical memory addresses, size of the memory region, as well as further parameters related to the performance, protection and access for the memory region.

A subsystem may use its own logical address space for addressing memory regions via the memory management unit without knowing the actual physical memory address. The logical starting address which may also be stored in the parameter table as stated above is the address the memory region begins at as seen from the subsystem. The memory management unit performs any necessary address translations between logical and physical memory addresses. In this way, the actual physical memory structure (such as several memory dies of different types) may be hidden from the subsystems itself.

A further aspect of the memory management scheme, which may be implemented in exemplary embodiments, is a transfer of ownership. That is, instead of allocating and de-allocating physical memory regions to subsystems and copying memory content between regions, the ownership as defined above may be transferred from one subsystem to another. For example, a first subsystem could request memory, and the memory management unit would allocate a suitable memory region if possible. In case the first subsystem does not have use for the allocated memory region anymore, an ownership transfer to a second subsystem may be performed.

Such a transfer is again effected via the memory management unit and the region codes assigned to each allocated region. The first subsystem may request an ownership transfer, indicating its subsystem identifier along with the region code of the respective memory region to the memory management unit. Then, the memory management unit may remove this subsystem ID from the entry associated with the memory region in its stored parameter table. Now, the memory region is available for registration by another subsystem. To make the transfer possible, the first subsystem may communicate the region code of the memory region to the second subsystem, optionally along with further parameters. The second subsystem receives these parameters relating to the memory region and may use them to register as a new owner of this memory region at the memory management unit. For this purpose, the second subsystem may communicate an ownership request indicating all necessary memory region parameters along with its subsystem ID. The memory management unit is then able to update the parameter table by entering the new subsystem identifier of the second subsystem at the owner field of the respective memory region. All other parameters remain unchanged as they were stored in the parameter table. Thus, a memory region is now accessible to a different subsystem without any unnecessary copying of memory content, by simply transferring the ownership from one subsystem to another based on the region code.

All requests, acknowledgements and parameter transfers may be done by dedicated messages which are communicated between the memory management unit and the subsystems and/or between two subsystems. Signals to the memory management unit IMMU may be transmitted via the memory interface, and the control interface may be used for all communication between subsystems. These interfaces may for example be logically arranged as defined above and shown in FIG. 1.

Besides the exemplary memory management scheme as described above, further embodiments may employ different memory management schemes to achieve an efficient memory usage of the several memory units and dies included in the integrated chip.

The use of the 3D integration according to the invention, which is exemplarily depicted in FIG. 2, enables the use of extremely wide buses (e.g. at least thousands of bits wide). Inter alia this allows solving a problem that may appear in arrangements using a central memory, namely the occurrence of memory bandwidth bottlenecks due to the utilization of a single central memory by multiple subsystems.

The DRAMs (or any other types of RAM) to be used in the invention need to have pre-defined sockets for the DRAM configuration and data interfaces. In addition the sockets on the opposite sides of the memory die need to have an interconnection between them, e.g. with a silicon-through VIA. This is required to enable the vertical stacking and establishing the vertical Z-bus connections. If the location of these sockets is pre-defined this enables the stacking of several DRAM dies and also other memory dies (SRAM, FLASH, etc.)- or even additional logic dies—on top of the subsystem dies.

This might require a two-part addressing scheme where the first part of a memory address comprises the memory die identification and the second part comprises the address inside the memory. In the 3D implementation of the invention the power and ground signals may also be distributed using additional silicon-through VIAs (for data and configuration). In addition, the heat can be led away from the dies through thermal VIAs.

Figure 2B:
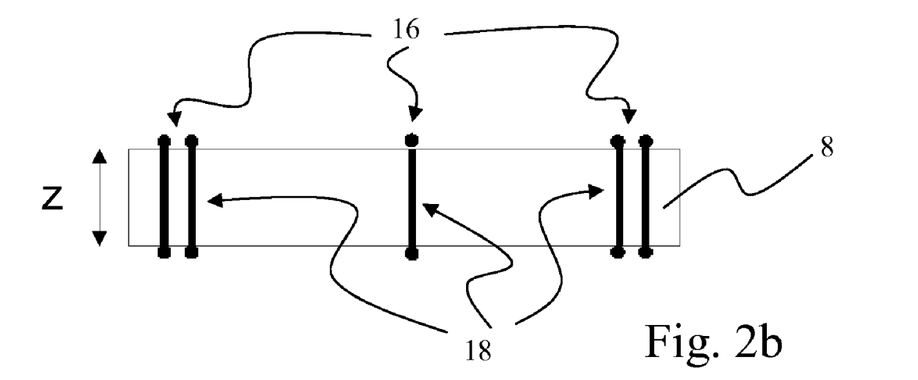
FIG. 2b is a cross-section of a memory die of the exemplary chip arrangement of FIG. 2.
Figure 2C:
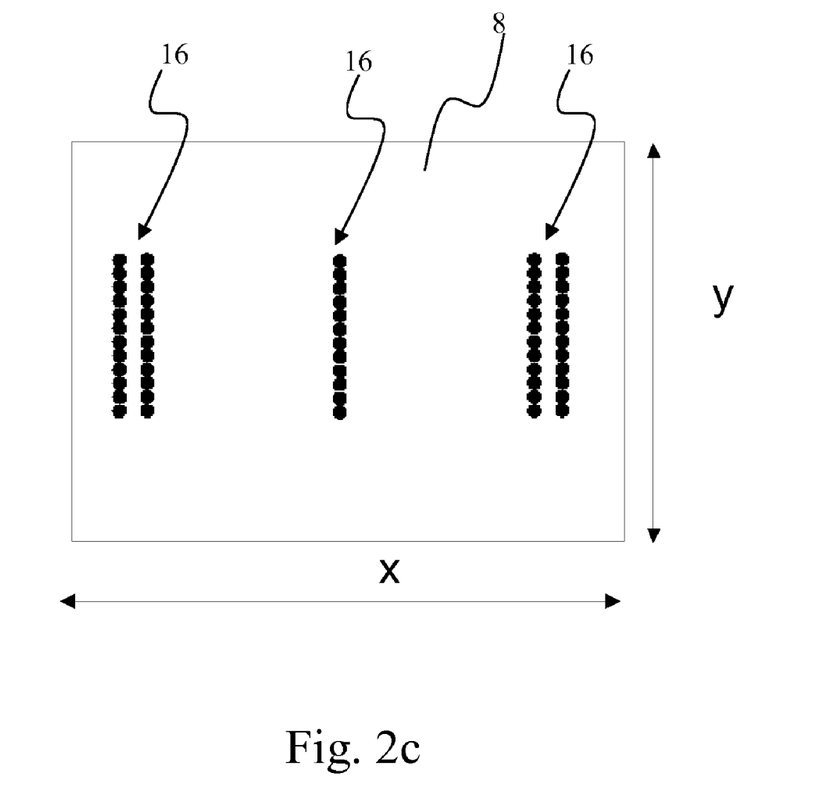
FIG. 2c is a plan view of a memory die of the exemplary chip arrangement of FIG. 2.

FIGS. 2b and 2c depict in detail the location of the silicon through-VIAs 18 and the memory and configuration interfaces and their respective sockets (commonly denoted by 16) on the memory die 8. In FIG. 2b a cross section through the memory die 8 is shown, wherein the silicon through VIAs 18 extend in the z-direction, and connect the sockets 16 located on the upper and lower faces of the memory die 8.

FIG. 2c is a plan view of the memory die 8 of FIG. 2b, wherein the locations of the memory and configuration interface sockets 16 are illustrated. Due to the utilization of the face area of the die 8 for locating the sockets 16, extremely wide busses are enabled, compared to the conventional packages which comprise the sockets only on their edges.

Figure 3:
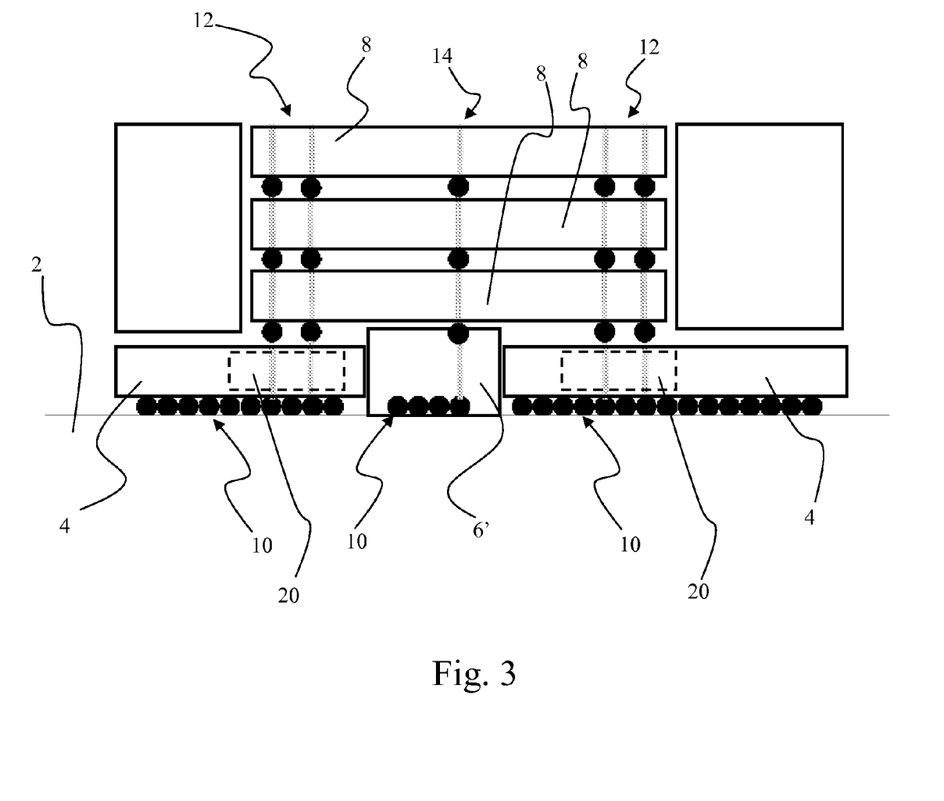
FIG. 3 is a cross-section of an alternative embodiment of a 3D chip arrangement according to the invention.
Figure 4:
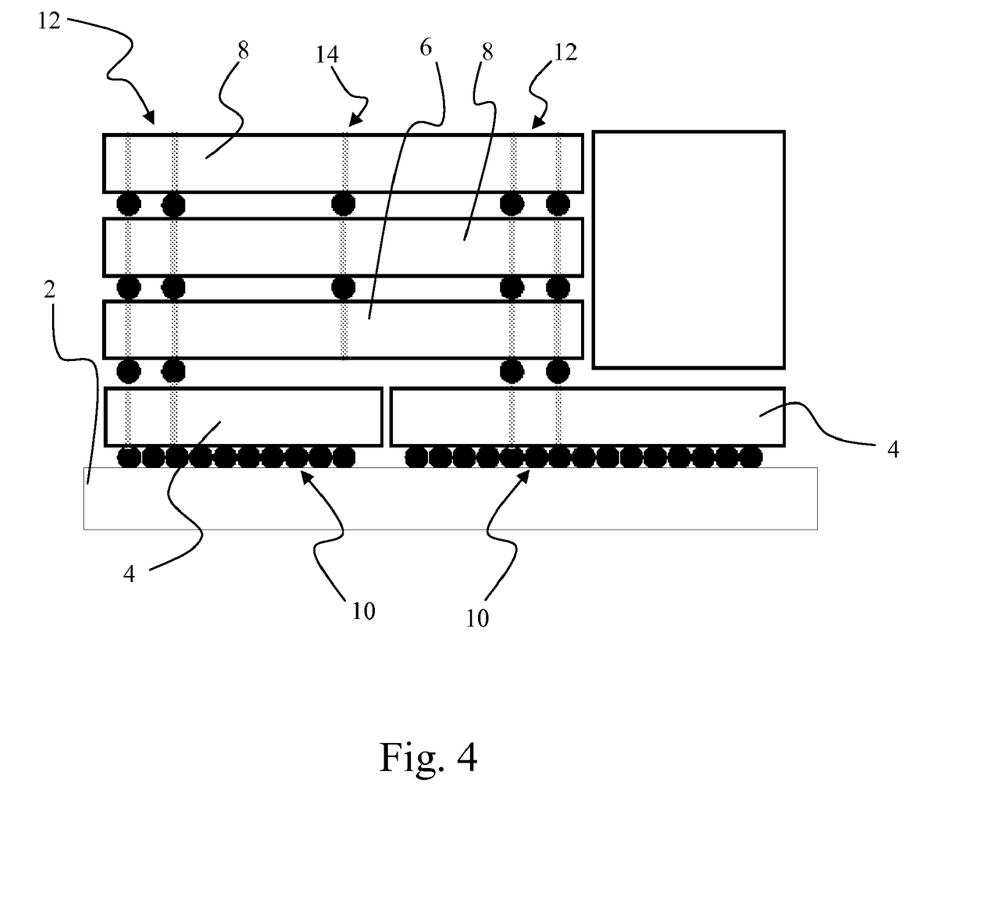
FIG. 4 is a cross-section of another alternative embodiment of a 3D chip arrangement according to the invention.

Two further exemplary embodiments of the invention are depicted in FIGS. 3 and 4. FIG. 3 shows the division of the memory management unit into local memory management units (implemented in the logic dies 4 and depicted by the dashed boxes 20) and a global memory management unit 6'. The other components are arranged identical to FIG. 2. In the exemplary embodiment of FIG. 3, the memory interface 12 is implemented via the face-to-face connections and the control interface 10 is implemented within the chip substrate 2. In this case, the memory management unit is not located directly between the logic dies 4 and memory dies 8 and therefore it needs to be split up into a global 6' and local management units 20. The global memory management unit 6' keeps track of system level issues and configures tables inside the local memory management units 20 that they require for address translations and memory protection.

FIG. 4 shows another exemplary implementation comprising only a single memory management unit 6, which is however located between the memory dies 8 and the logic dies 4. The other components are arranged identical to FIG. 2.

The invention makes the use of memory more efficient, which enables smaller system sizes and, therefore, reduced system costs. The smaller system size together with the scheme for organizing the memory allocations in the physical memory makes the invention very valuable from energy-efficiency point of view (unused memory banks/memory dies can be turned off). In addition, the invention can hide the actual memory implementation from the subsystems.

One effect of the approach having a centralized shared memory compared to the use of dedicated memories for each subsystem is a possible decrease in available memory bandwidth and excess communication for memory allocations. When the memory is shared among multiple subsystems, the congestion of the shared resource can cause prolonged waiting times. In addition, the system needs an additional control unit and a standardized multi-stage scheme for memory usage. The very wide connections which are made possible by the face-to-face memory interface offering massive parallel I/O can compensate for the decrease in bandwidth and thus prevent the formation of any data bottlenecks.

By the chip arrangement of the invention secure data storage is offered, by blocking any unauthorized accesses to memory. Furthermore, with respect to data security, tapping the memory connection becomes extremely difficult since it is changed from a conventional package-to-package connection into a face-to-face connection. No logical changes in the legacy application software or subsystem die are required. Multiple product variants can be implemented with different cost-performance trade-offs without modifying the software.

The short connections between the memory and the logic according to the invention result in faster operation speed, lower energy consumption per transferred bit, and also the transistors driving the signals can be dimensioned smaller (smaller area). The invention can also help to decrease the bill-of-materials (BOM), compared to dedicating a separate memory to every subsystem as conventional. The PWB area is decreased due to the additional possibilities for die stacking.

The provision of a memory interface and a control interface enables for specific optimization of these interfaces. For example it would be possible to provide the memory interface with very wide buses, thus enabling massive parallel data transfer, while the control interface (which only needs to transfer relatively smaller amounts of data) is optimized to have very low latencies. Such an embodiment would require implementing the two interfaces as separate physical interfaces, one optimized for massive parallel data transfer and the other for reduced latency. However, it should be noted that the memory interface and the control interface do not need to be separate physical entities; instead the invention also includes implementing them as logical interfaces on a shared common physical network interface.

A further advanced embodiment of the invention further comprises a memory network implemented on the memory die.

Figure 5:
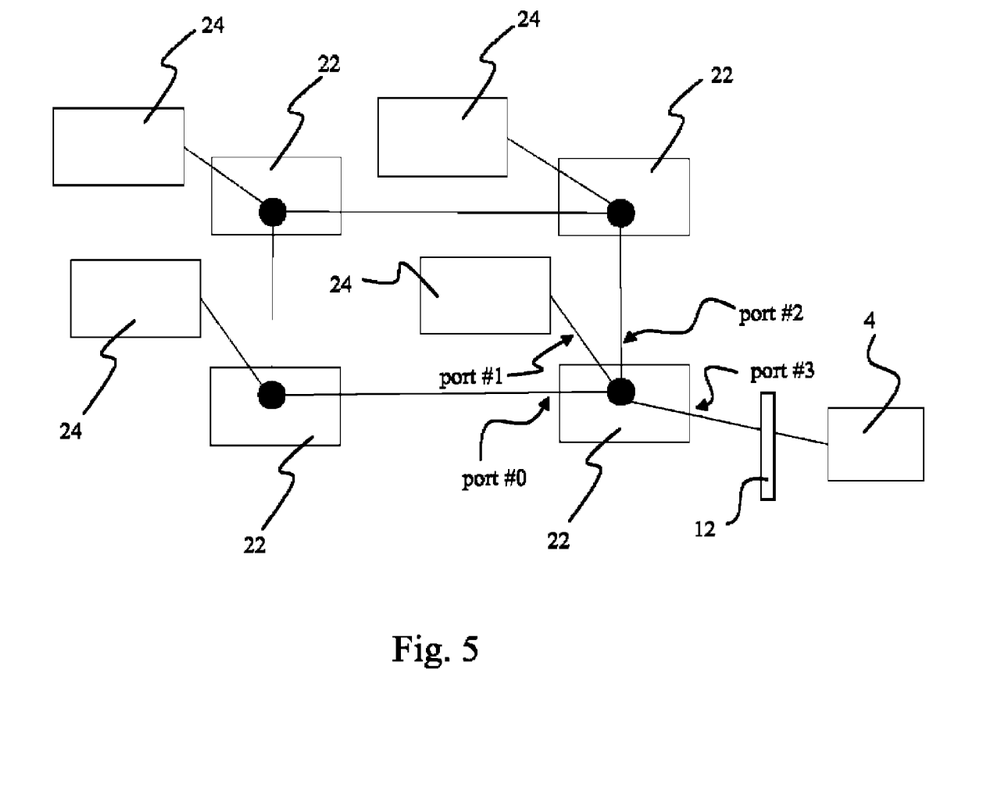
FIG. 5 shows the topology of the memory and the memory internal blocks of an exemplary embodiment of the invention.

An exemplary embodiment incorporating this memory network is depicted in FIG. 5. The memory network is composed out of routers 22 forming a mesh topology and memory modules 24 connected to these routers 22. Each router 22 also acts as a connection point to the outside world (=logic die 4) utilizing a face-to-face connection, via the memory interface 12. These connections or sockets need to be pre-defined, including their location, number, implementation and protocols.

The routers 22 comprise ports (in this example port #0 . . . port #3), wherein port #3 is connected via the memory interface 12 with a subsystem or logic die 4. Port #1 is connected with a memory bank or module 24, while ports #0 and #2 are connected with other routers 22.

The basic idea behind this aspect of the invention is that the memory is arranged as the interconnection, i.e. the memory die is organized such that data transfers are enabled through it and, therefore, implicitly buffering the transferred data. The face-to-face connection between the memory and the logic die(s) is used to offer massive parallel I/O without separate packages for logic and memory to reduce the bill-of-materials (BOM). The memory interconnection uses a mesh topology and a packet-switched routing scheme.

Controlling the interconnection is done by a global intelligent memory management unit, which may be implemented on the logic die or as a separate die, or on memory die(s), and which configures the routers 22 which are implemented on the memory die(s), as well as the local memory management unit(s) in each subsystem or on the respective logic die 4. The invention uses two ways to transfer memory from one subsystem to another: transferring a handle (or region code) or doing a DMA transfer which is done internally by the memory.

A key component in an exemplary embodiment of this aspect is the global memory management unit which keeps track of global memory allocated for subsystems, receives and processes requests for memory allocations, and configures the local management units of subsystems. The global memory management unit does not have to be a centralized component; its functionality can also be distributed to several physical entities. However, the global memory management unit does have a unique, pre-determined network access through which it can always be accessed from the memory network.

The local memory management units comprise a table (which can be configured by the global memory management unit) for address translation and memory protection. It is used to translate the address from a subsystem logical address into a memory/memory network physical address. The memory protection scheme employed here does not allow for a subsystem to use unallocated memory. After allocation of a memory region by the global memory management unit, a local memory management unit can sub-allocate memory from that region if requested to do so by the subsystem.

Routers route the data between the subsystems and the memory blocks. They use store-and-forward routing, based on x and y coordinates of the destination router, wormhole routing, virtual cut-through routing, or source routing (where a local memory management unit provides the route). The organization of the routers 22, the memory modules 24 and the logic die 4 is presented in FIG. 5.

Figure 6:
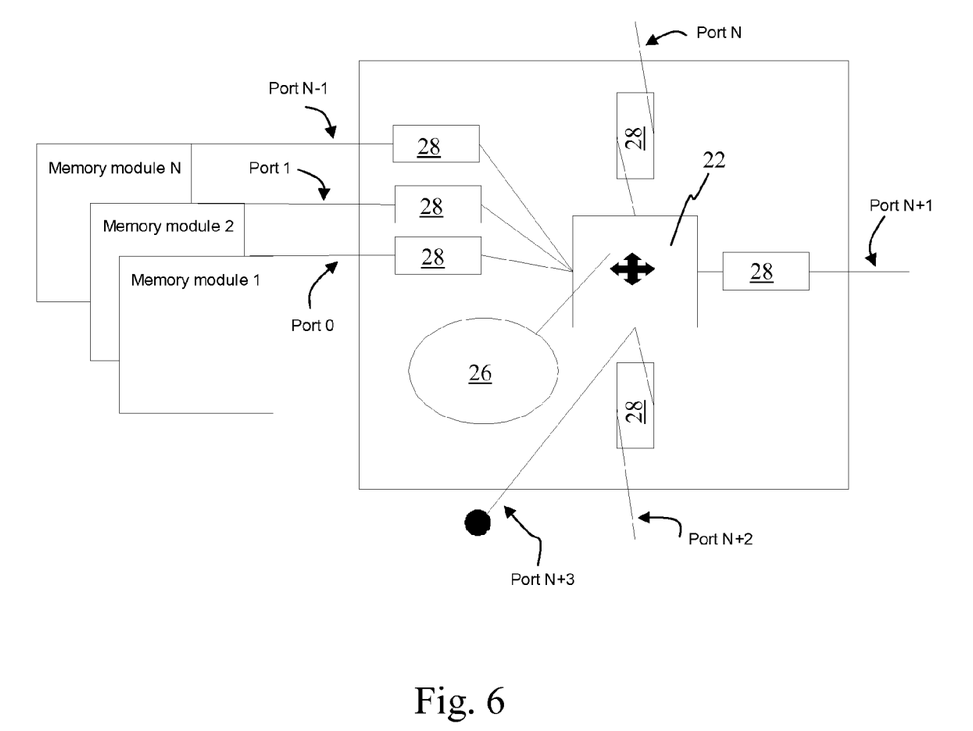
FIG. 6 is another schematic view illustrating an exemplary router implementation of an exemplary embodiment of the invention comprising a memory network.

An example router implementation is depicted in FIG. 6. A central router 22, comprising a packet-oriented switch, is connected with a number of buffers 28, which are respectively provided in a number of ports 0 . . . N+3. The router 22 includes a routing control 26. Ports 0 to N−1 are connected with memory modules 1 . . . N. Ports N to N+2 are connected with neighboring routers (not shown), while port N+3 is connected to a logic die (not shown) via a face-to-face connection. In this arrangement the actual structure of the memory network, which is constituted by the routers and the memory modules, is hidden from the subsystem on port N+3.

There are several basic operations that are done through the configuration interface:

each router (R) has a unique Router ID (RID) that can be queried from it (typically its X, Y-coordinates)

a local memory management unit can ask for its RID, the router returns the RID (if many routers are connected to a local memory management unit, then several RIDs are returned)

the local memory management unit asks for x bytes of memory from the global memory management unit and gives one of its RIDs. The global memory management unit allocates memory and assigns a handle H1 for that memory region. It then returns an RID, the correct port number, the physical address inside the physical memory block, and the handle     after allocation, the local memory management unit begins to use its memory identified by RID, port number, and physical address.

Figure 7:
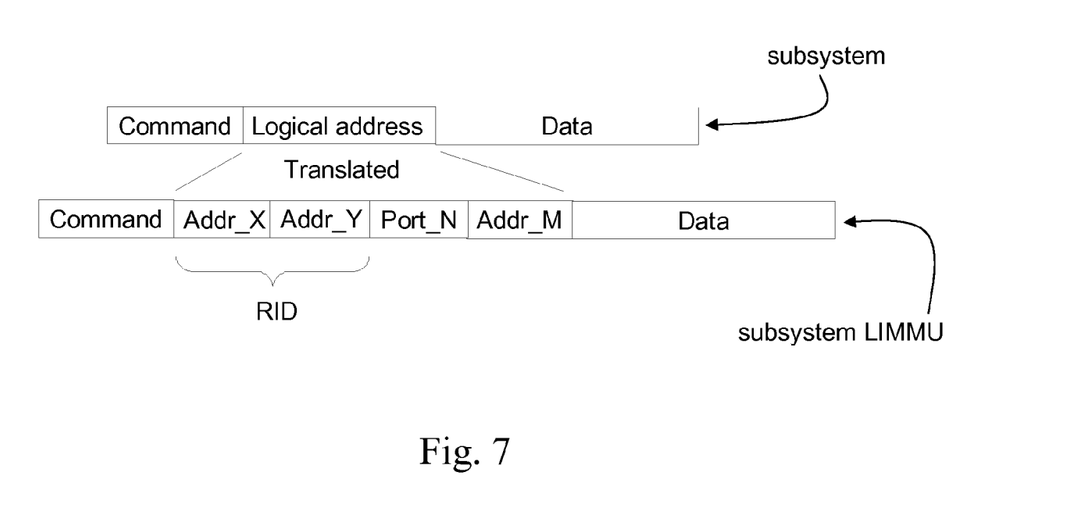
FIG. 7 shows the structure of a packet used in write operations of a memory network according to an embodiment of the invention.

The write packet and the address translation required are shown in FIG. 7. The subsystem issues the write packet comprising command, logical address and data. The local memory management unit LIMMU then translates the logical address into a physical address comprising the router ID=RID, which is used for routing through the mesh, basically comprising the X and Y coordinates Addr_X and Addr_Y, the number of the output port PORT_N in the destination router and a physical address Addr_M used as address inside the memory module.

Figure 8:
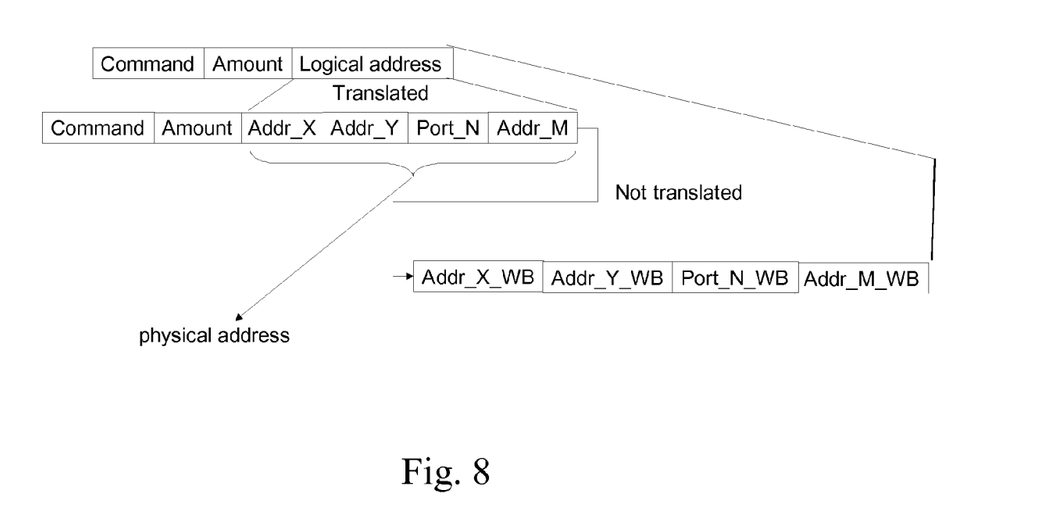
FIG. 8 shows the structure of a packet used in read operations of a memory network according to an embodiment of the invention.

The corresponding read packet is presented in FIG. 8. The subsystem issues the read packet comprising command, the amount of data to be read, the logical address from which the data should be read from, and some further fields used for data write back. The logical address is translated by the LIMMU in a similar manner than in the write packet. The write back fields are used for identifying where the answer to the read request should be sent to using the write packet already described. This includes the write back X and Y coordinates Addr_X_WB and Addr_Y_WB, the write back port Port-_N_WB, and the write back address inside the subsystem logical memory space Addr_M_WB.

It is to be noted that the subsystems themselves are not aware of physical addresses, RIDs, and port numbers. These values are added to the packet by their local memory management unit.

Figure 9:
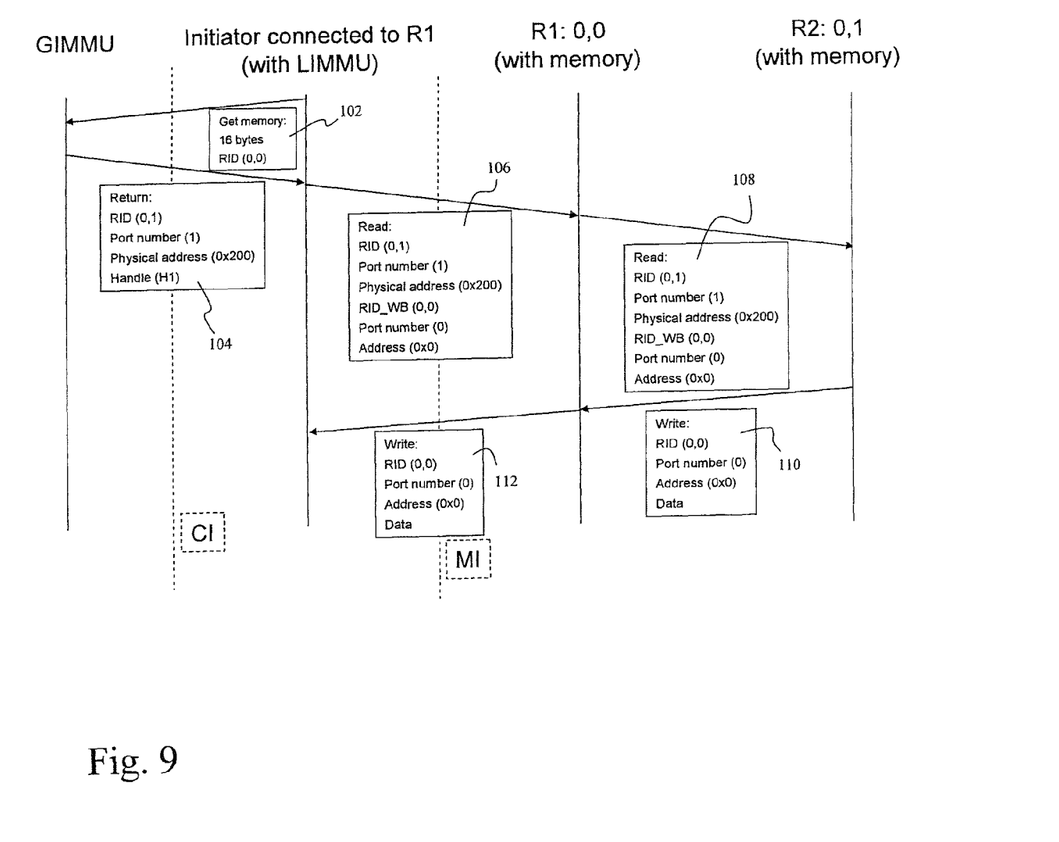
FIG. 9 shows an example of a read operation in a memory network according to the invention.

Read operations are answered by a write operation (through the memory interface). In this case, the address of the write is generated from the read packet (Local address+ number of that read in a possible burst times the word length utilized). An example of a read operation is depicted in FIG. 9. This means that the local memory management unit does not have to do any address translations to an upcoming write and it can find the correct order of the incoming data packets.

In FIG. 9 a subsystem SS connected with router R1 (via the local memory management unit LIMMU) issues a request in step 102 for 16 bytes of memory. In the request, the router ID of router R1 may be included to allow the allocation of a suitable memory region. In step 104 the global memory management unit GIMMU returns a router identifier RID (0,1), port number (1), physical address (0x200) and handle H1 of an allocated memory region to the LIMMU. These transfers are both performed via the control interface CI. In step 106 the LIMMU issues a read request comprising the address data received from the GIMMU, to router R1 (0,0) via the memory interface MI. The read request may e.g. include the router ID associated with the allocated memory region, the port number, physical address, as well as an write-back router identifier RID_WB, the associated port number and address. This request may thus be used by the subsystem to request that the data stored at physical address (0x200) as shown in FIG. 9 be read and written to its own address space at address (0x0). In step 108 the router R1 forwards the request to router R2 (0,1), which in turn (in step 110) issues a write back response using the write-back address received in the forwarded request, and including the read data. Router R1 then forwards the response back to the subsystem, via the memory interface MI, in step 112.

Transfer of a handle or region code can, according to some embodiments of the invention, be performed in this manner, as was already described generally above in connection with the exemplary memory management scheme:

Ownership of a memory region can be passed from one subsystem to another by sending the region code and notifying the global memory management unit of the operation;

The new subsystem can register as the owner of the region with the region code;

In addition to the region code, the global memory management unit also gives the physical address, RID, and port number.

This is true both in the original memory allocation and the ownership transfer.

A subsystem (via the local memory management unit) can also ask for a DMA (Direct Memory Access) transfer from the global memory management unit. This implementation has two options:

the global memory management unit performs the DMA (first reads and then writes the data)

the global memory management unit issues a DMA command to a memory internal DMA (with source address, destination address, and amount of data which are given through a register interface of the internal DMA).

The DMA transfer is possible inside the memory region of one subsystem. If data is moved from one subsystem to another, the ownership is transferred first.

This memory management scheme guarantees that there is always only one owner for a specific memory region (identified by the region code). The scheme also guarantees that no processor or other memory user can access memory that has not been assigned to it (it does not have an active region code). In an advanced scheme, the same region code could be given to multiple users. This would result in memory space that is simultaneously read and writable by multiple users. Hence, shared memory and "scratch space" type of memory usage would be enabled. Furthermore, some systems might benefit from read-only region codes, enabling reading but not writing from a specified memory region.

There are the following possible connection relations within the memory network implementation of the invention:

1 subsystem is connected to 1 router

N subsystems are connected to 1 router 1 subsystem is connected to N routers

A memory bank or module can internally be organized into several separate memory blocks. Store-and-forward is a possible routing implementation, but wormhole, virtual cut-through, source etc. are also possible. The network can have out-of-order transfers but no packets can be lost in normal operation.

Also, acknowledge messages can be implemented for reads and writes:

messages can acknowledge a single read/write or a burst messages can acknowledge the transfer when they have received it or when they have processed it Negative acknowledgement means a transfer error which calls for a retransmission.

A transfer can also have a request ID (inside the command field) for separating several transactions into the same address. The request ID can be a running number or a pseudo-random number. Standard error correction schemes (parity, CRC) can be added to the packet scheme.

All embodiments, descriptions and explanations given in this document should not be understood as limiting, but were given by way of example only to enable an understanding of the invention. All features and details described for a specific embodiment may be transferred to and combined with any of the further described embodiments, as long as they are not mutually exclusive. A person skilled in the art will easily recognize that many modifications, improvements, and various combinations of the above embodiments are possible without departing from the spirit and scope of the invention.

What is claimed is:

1. A chip arrangement comprising:
a plurality of dies, wherein at least some of said dies are stacked face-to-face on top of each other and connected via sockets arranged on the respective faces in predefined patterns, wherein the sockets collectively form a bus that runs through all of the stacked dies;
said dies comprising
at least one memory die comprising at least one memory module, and
at least one logic die comprising at least one subsystem;
said chip arrangement further including a memory management unit connected to said at least one memory die and said at least one logic die, wherein said memory management unit is adapted for managing memory accesses from said at least one subsystem to said at least one memory module via the bus.

2. The chip arrangement of claim 1, wherein at least some of said dies are connected to each other via silicon-through-vias.

3. The chip arrangement of claim 1, wherein at least one of said at least one logic dies is arranged on a base substrate.

4. The chip arrangement of claim 3, wherein at least one memory die is stacked on top of said at least one logic die.

5. The chip arrangement of claim 1, wherein at least one of said logic dies is stacked on top of said at least one memory die.

6. The chip arrangement of claim 1, comprising at least two memory modules, and further comprising a router connected to at least two of said memory modules, said router being adapted for routing data traffic to and from said at least two memory modules.

7. The chip arrangement of claim 6, wherein said router is arranged in one of said at least one memory dies.

8. The chip arrangement of claim 1, wherein said memory management unit is implemented in at least one separate die.

9. The chip arrangement of claim 8, wherein said memory management unit is stacked between said at least one logic die and said at least one memory die.

10. The chip arrangement of claim 1, wherein said memory management unit is included in one of said at least one logic dies.

11. A method, comprising:
allocating a first memory region to a first and second subsystem by a memory management unit, wherein said first and second subsystems are part of a respective first and second logic die and said memory region is part of a first memory die both included in a chip arrangement comprising at least the first memory die and one or more of the first and second logic dies stacked face-to-face with each other;
generating, by said memory management unit, a region code associated with said allocated memory region;
storing said region code in connection with an address of said memory region; and
defining said first and second subsystem as respective first and second owners for said memory region by storing unique subsystem identifiers together with said region code in a parameter table at said memory management unit.

12. The method of claim 11, further comprising transmitting parameters related to said memory region between said subsystem and said memory management unit via a logical memory interface.

13. The method of claim 11, further comprising transmitting parameters related to said memory region from said first subsystem to a second subsystem via a logical control interface.

14. The method of claim 13, wherein said logical control interface is provided via a face-to-face connection between said logic die and said memory die.

15. The method of claim 11, further comprising transferring ownership of said memory region to a third subsystem by changing said stored subsystem identifier at said parameter table.

16. The method of claim 11, further comprising providing at least one additional local memory management unit on at least one of said memory dies.

17. The method of claim 16, wherein said step of allocating a memory region further comprises said local memory management unit forwarding a request for memory allocation from said subsystem to said memory management unit.

18. The method of claim 17, wherein said memory allocation request includes a unique router identifier of a router element associated with said requesting subsystem.

19. The method of claim 16, further comprising transmitting an allocation acknowledgement from said memory management to said local memory management unit.

20. The method of claim 19, wherein said allocation acknowledgement includes a unique router identifier of a router element connected to said allocated memory region.

21. The method of claim 20, wherein said allocation acknowledgement includes at least one of the following parameters: a port number for said router element, a physical memory address of said memory region, a region code of said allocated memory region.

22. The method of claim 16, further comprising said local memory management unit translating a physical memory address received from said memory management unit into a local memory address specific to said subsystem.

* * * * *